United States Patent
Okuno et al.

(10) Patent No.: US 6,420,281 B2
(45) Date of Patent: Jul. 16, 2002

(54) METHOD OF FORMING OXIDIZED FILM ON SOI SUBSTRATE

(75) Inventors: Takuya Okuno; Akira Yamada, both of Nukata-gun; Yoshiaki Nakayama, Okazaki, all of (JP)

(73) Assignee: Denso Corporation, Kariya (JP)

( * ) Notice: Subject to any disclaimer, the term of this patent is extended or adjusted under 35 U.S.C. 154(b) by 62 days.

(21) Appl. No.: 09/729,778

(22) Filed: Dec. 6, 2000

(30) Foreign Application Priority Data

Dec. 24, 1999 (JP) .......................................... 11-366454

(51) Int. Cl.[7] .......................................... H01L 21/324
(52) U.S. Cl. ........................ 438/787; 438/517; 438/530
(58) Field of Search ................................ 438/517, 514, 438/530, 479, 778, 787, 967

(56) References Cited

U.S. PATENT DOCUMENTS

| 5,360,748 A | 11/1994 | Nadahara et al. |
| 5,480,832 A | 1/1996 | Miura et al. |
| 6,001,711 A | 12/1999 | Hashimoto |
| 6,057,036 A | 5/2000 | Okonogi |
| 6,204,198 B1 * | 3/2001 | Banerjee et al. ........... 438/766 |
| 6,242,787 B1 | 6/2001 | Nakayama |

FOREIGN PATENT DOCUMENTS

| JP | 58-165328 | 9/1983 |
| JP | 60-98679 | 6/1985 |
| JP | 7-30114 | 1/1995 |
| JP | 8-23097 | 1/1996 |
| JP | 9-139438 | 5/1997 |

OTHER PUBLICATIONS

U.S. patent application Ser. No. 08/834,386, Kitamura, filed Apr. 16, 1997.

* cited by examiner

*Primary Examiner*—Richard Elms
*Assistant Examiner*—Beth E. Owens
(74) *Attorney, Agent, or Firm*—Law Offices of David G. Posz

(57) ABSTRACT

One or more capacitors are formed using thermally oxidized films formed on a silicon layer of an SOI substrate. The capacitors may be formed alone or together with other semiconductor elements on a single SOI substrate. A diffuse layer having an impurity in a high density is first formed on the silicon layer, and then an oxidized film is formed on the diffused layer by thermal oxidation. Then, contaminants in the oxidized film are driven-out under a high temperature heat treatment, thereby to improve quality of the oxidized film, such as durability against a high voltage. Plural capacitors may be formed using oxidized films having a respectively different thickness, by repeating thermal oxidation and removal of the oxidized film.

21 Claims, 10 Drawing Sheets

METHOD OF FORMING OXIDIZED FILM ON SOI SUBSTRATE

CROSS-REFERENCE TO RELATED APPLICATION

This application is based upon and claims benefit of priority of Japanese Patent Application No. Hei-11-366454 filed on Dec. 24, 1999, the content of which is incorporated herein by reference.

BACKGROUND OF THE INVENTION

1. Field of the Invention

The present invention relates to a method of manufacturing a semiconductor device on an SOI (Silicon on Insulator) substrate, and more particularly to a method of forming an oxidized film on a silicon layer of the SOI substrate.

2. Description of Related Art

In a conventional method of manufacturing capacitors or MOS transistors on a silicon substrate, an impurity is diffused into the silicon substrate in a high density to form a highly doped layer, and then an oxidized film is formed on the highly doped layer. Electrodes made of poly-silicon or the like are formed on the silicon dioxide film.

It is frequently required that such a silicon dioxide film has a high quality to be durable against a high voltage. However, such a high quality is difficult to be realized when the oxidized film is formed on the highly doped layer. This is because the highly doped layer tends to become a gettering site and the silicon dioxide film is contaminated with contaminants such as heavy metals, and the durability of the silicon dioxide film is adversely affected by the contaminants.

It is possible to form an additional gettering layer in the silicon substrate to improve the quality of the oxidized film. However, it is generally difficult to form such a gettering layer in the SOI substrate. JP-A-10-25621 proposes to form the gettering layer in the SOI substrate, but at least an additional costly process to form the same is required in a series of manufacturing processes of a semiconductor device.

SUMMARY OF THE INVENTION

The present invention has been made in view of the above-mentioned problem, and an object of the present invention is to provide a method of forming a quality oxidized film on the SOI substrate without using the process of forming the gettering layer.

An impurity such as boron or phosphorus is diffused into a silicon layer on an SCI substrate by ion-implantation and driven-in, thereby forming a diffused layer having a high density of the impurity on the SOI substrate. Then, an oxidized film is formed on the diffused layer by thermal oxidation. The oxidized film is heat-treated at a high temperature of 1100° C. or higher, preferably 1150° C. or higher. When boron is diffused to form the diffused layer, the high temperature heat treatment is performed for 20 minutes or longer. When phosphorus is diffused, the high temperature heat treatment is performed for a period of 20 minutes or longer but not exceeding 60 minutes.

By applying the high temperature heat treatment to the oxidized film, contamination in the oxidized film is driven-out, or annealed-out. Thus, the quality of the oxidized film such as durability against a high voltage is improved.

To form a capacitor using the oxidized film, electrodes made of a material such as poly-silicon are patterned on the oxidized film. Other semiconductor elements such as an LDMOS (Lateral Diffused MOS) may be formed on the same SOI substrate in addition to the capacitor. In this case, the high temperature heat treatment can be performed as a common process for improving the quality of the oxidized film and for forming other semiconductor elements.

Further, plural capacitors, e.g., a first capacitor and a second capacitor may be formed using the oxidized films having respectively different thickness. In this case, a preliminary oxidized film covering both areas for the first and second capacitors is first formed. Then, only the oxidized film covering the second capacitor area is removed by wet-etching, keeping the preliminary oxidized film for the first capacitor. Then, the silicon layer is again thermally oxidized to form a new oxidized film covering both areas for the first and second capacitors. Thus, a thin film is formed for the second capacitor and a thick film is formed for the first capacitor. The high temperature heat treatment is performed either immediately after both oxidized films are formed or after the capacitor electrodes are formed on the oxidized films. The quality of both oxidized films is improved by a single high temperature heat treatment.

According to the present invention, the quality of the oxidized film or films formed on the SOI substrate is improved by the high temperature heat treatment without forming an additional gettering layer.

Other objects and features of the present invention will become more readily apparent from a better understanding of the preferred embodiment described below with reference to the following drawings.

DETAILED DESCRIPTION OF THE PREFERRED EMBODIMENT

A method of forming a capacitor on an SOI substrate will be described as an embodiment of the present invention. A capacitor is formed on the SOI substrate by forming an oxidized film and then forming poly silicon electrodes on the film. Details of the manufacturing process are shown in FIGS. 1A–1E. The SOI substrate is composed of three layers, a base silicon layer, a silicon dioxide insulation film formed on the base silicon layer and an upper silicon layer formed on the silicon dioxide insulation film. FIGS. 1A–1E only show the upper layers, i.e., the insulation film 1a and the upper silicon layer 1.

Figure 1A:
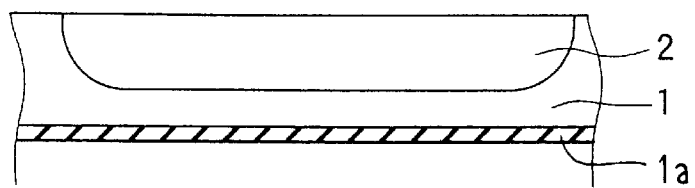
FIGS. 1A–1E are schematic cross-sectional views showing a process of forming a capacitor on an SOI substrate.
Figure 1B:
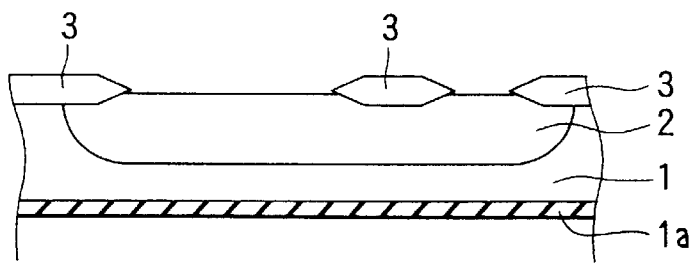
Figure 1C:
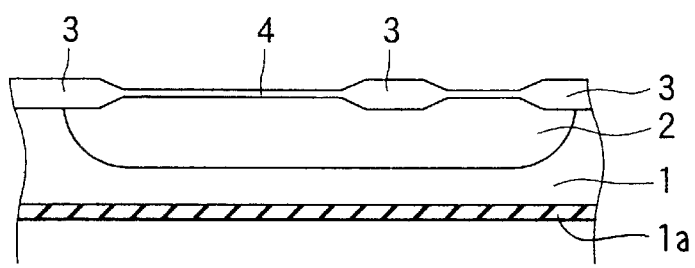

First, referring to FIG. 1A, an impurity such as boron or phosphorus is implanted by ion-implantation and driven-in into the silicon layer 1. The impurity is diffused to a predetermine depth, thereby forming a diffused layer 2 containing the impurity in a high density. The diffused layer 2 serves to reduce an electric resistance between electrodes of a capacitor. Then, LOCOS oxidation films 3 are formed on the diffused layer 2 for separating elements, as shown in FIG. 1B. Then, an oxidized film 4 is formed by thermally oxidizing an entire surface of the diffused layer 2, as shown in FIG. 1C.

Figure 1D:
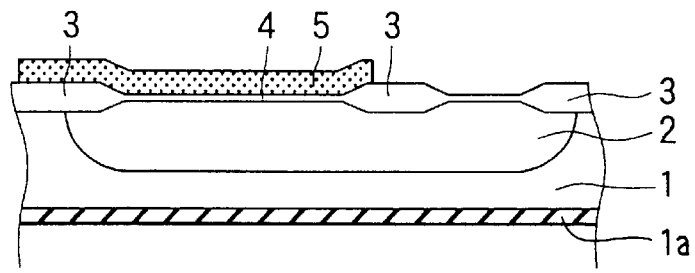
Figure 1E:
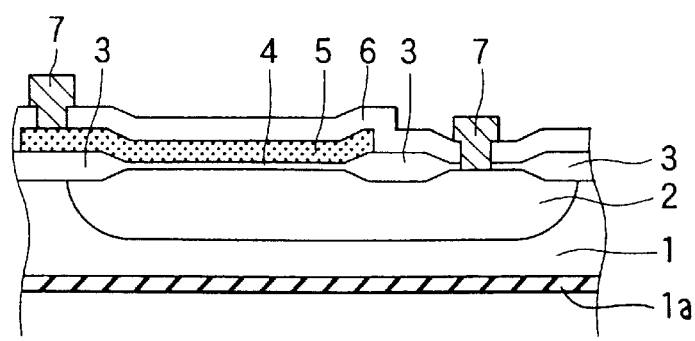

A phosphorus-deposited poly-silicon is patterned to form an electrode 5 on the oxidized film 4, as shown in FIG. 1D. Then, a high temperature heat treatment, e.g., at 1150° C. for 30 minutes, is performed. More particularly, the heat treatment is performed in an atmosphere in which $N_2$ is supplied at a rate of 10 l/min and $O_2$ at a rate of 0.1 l/min (hereinafter referred to as $N_2$ atmosphere). The temperature is raised from 800° C. to 1150° C. at a rate of 10° C./min, kept at 1150° C. for 30 minutes, and then lowered. Contaminants in the oxidized film 4 are annealed-out by the high temperature heat treatment. Then, as shown in FIG. 1E, a BPSG film 6 and a pair of aluminum wires 7 are formed. One aluminum wire 7 contacts the electrode 5, and the other aluminum wire 7 contacts the diffused layer 2. Thus a capacitor is formed on the silicon layer 1 of the SOI substrate.

Figure 2:
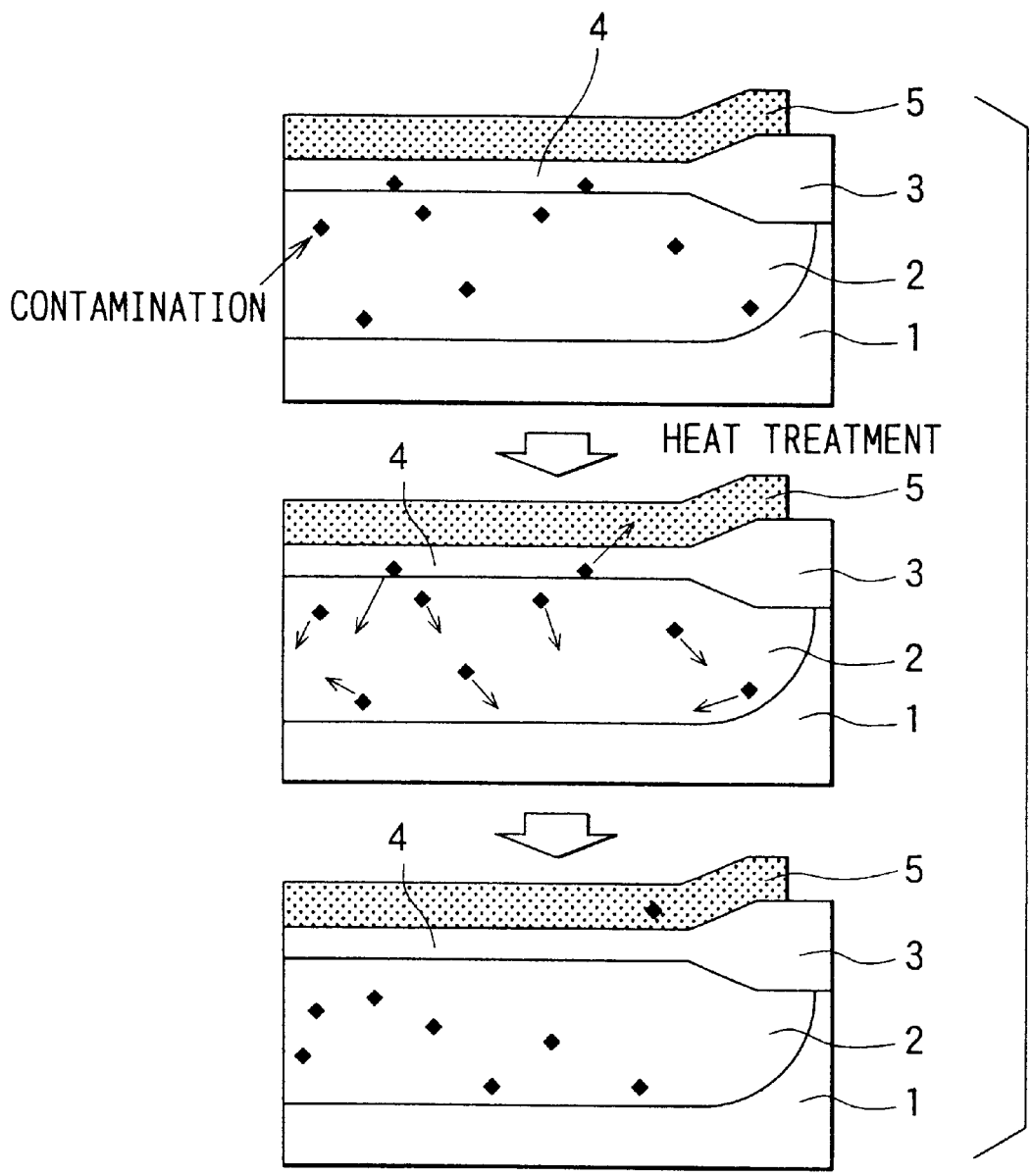
FIG. 2 is a schematic cross-sectional view showing the effect of high temperature heat treatment for improving quality of a thermally oxidized film.

FIG. 2 schematically shows a mechanism of annealing-out the contaminants in the oxidized film 4. Before the high temperature heat treatment is performed, as shown in the top figure, the oxidized film 4 is contaminated with contaminants such as heavy metals because the diffused layer 2 acts as a gettering site. The contaminants are annealed-out from the oxidized film 4 by the high temperature heat treatment as shown in the middle figure. As a result, there are no contaminants in the oxidized film 4 after the heat treatment, as shown in the bottom figure. Thus, the quality of the oxidized film 4 is improved. Other oxidized films such as a gate film of an MOS transistor can be treated in the same manner to improve the quality thereof.

A process for forming one capacitor on an oxidized film is described above. It is also possible to form plural capacitors on respective oxidized films having a respectively different thickness. Such oxidized films may be made by repeating oxidation and removal, or by overlaying another oxidized film on a previously formed film. An example of such a process will be described below with reference to FIGS. 3A–3G.

Figure 3A:
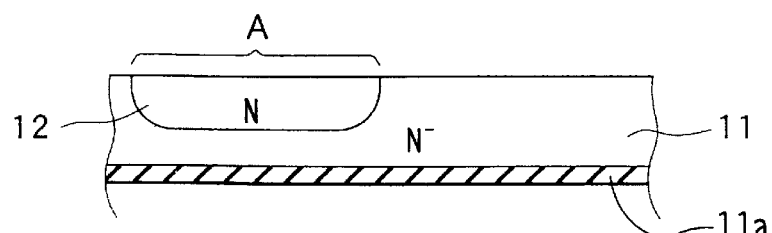
FIGS. 3A–3G are schematic cross-sectional views showing a process of forming two capacitors on respective oxidized films having thickness different from each other.
Figure 13A:
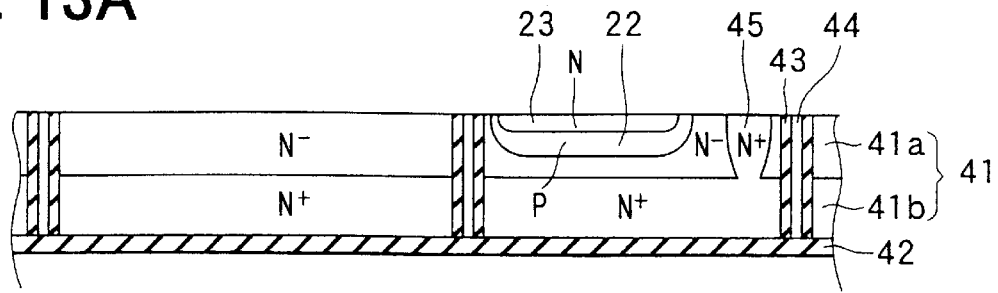
FIGS. 13A–13G are schematic cross-sectional views showing a process for forming two capacitors on respective oxidized films having thickness different from each other together with an LDMOS.
Figure 13B:
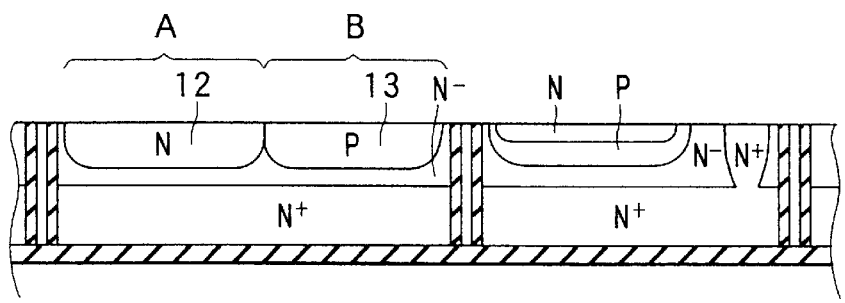

In this example, a silicon layer 11 formed on an insulation film 11a of an SOI substrate is an $N^-$ type layer. The silicon layer 11 is divided into two regions, region A for forming a first capacitor thereon and region B for forming a second capacitor thereon. As shown in FIG. 3A, a first diffused layer 12 in which phosphorus is diffused with a high density by ion-implantation is formed on the silicon layer 11. The first diffused layer 12 is formed only in region A by masking region B. As shown in FIG. 13B, a second diffused layer 13 in which boron is diffused with a high density is similarly formed in region B of the silicon layer 11.

Figure 13C:
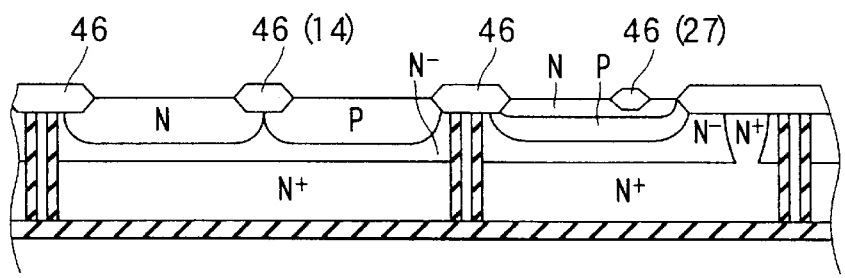
Figure 13D:
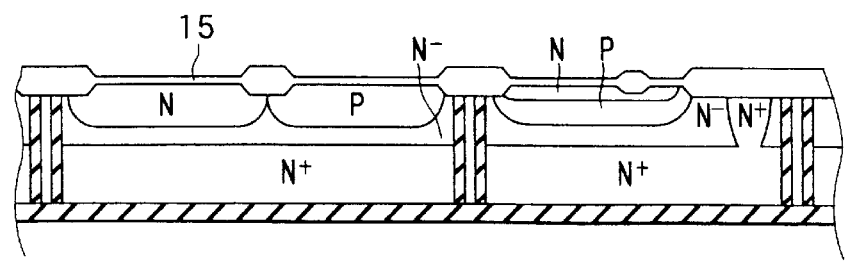

Then, a LOCOS oxidation film 14 is formed between region A and region B to separate two regions, as shown in FIG. 13C. Then, an oxidized film 15 is formed by thermally oxidizing an entire surface of the first and second diffused layers 12, 13, as shown in FIG. 13D. Then, the oxidized film 15 covering the second diffused layer 13 is removed by wet etching while keeping the oxidized film 15 covering the first diffused layer 12 as it is, as shown in FIG. 3E. Then, the oxidation process is repeated to form a new oxidized film covering both regions A and B. As a result, the oxidized film 15 covering region A becomes thicker because the newly formed film overlays the previous film, while an oxidized film 16 covering region B is thin because it consists of only the newly formed film, as shown in FIG. 3F. Then, electrodes 17, 18 are formed by patterning phosphorus-deposited poly-silicon on the oxidized films 15, 16. Thus, two capacitors are formed on the silicon layer 11 of the SOI substrate.

It is found out through experiments, however, that the quality of the oxidized film is adversely affected by repeating wet etching and oxidation or overlaying a new film on a previously formed film. Also, it is found out that a good film quality can be realized by properly setting conditions of the high temperature heat treatment. Some of the experimental results will be shown below, referring to FIGS. 4–11.

Figure 3B:
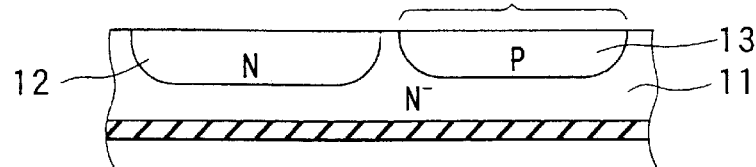
Figure 3C:
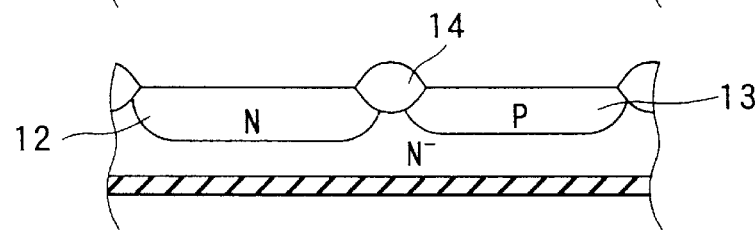
Figure 3D:
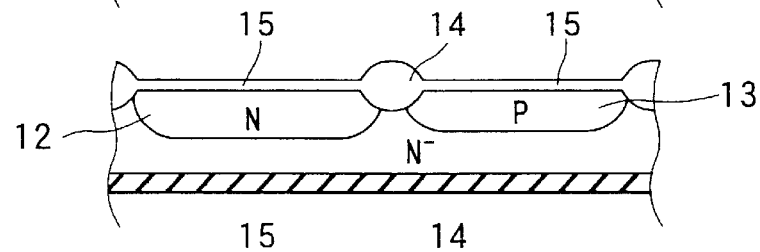
Figure 3E:
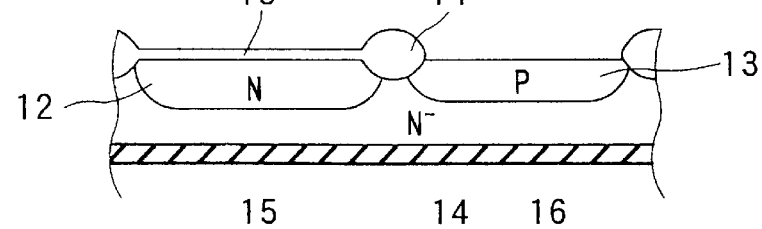
Figure 3F:
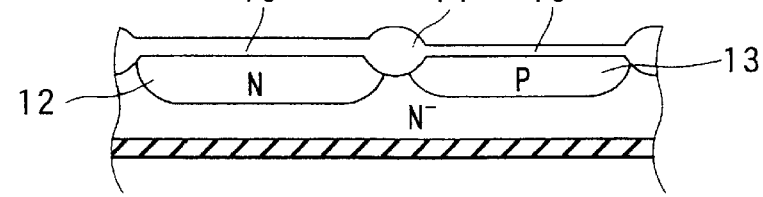
Figure 3G:
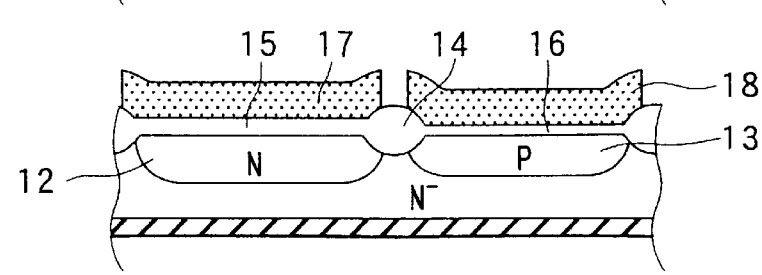
Figure 4:
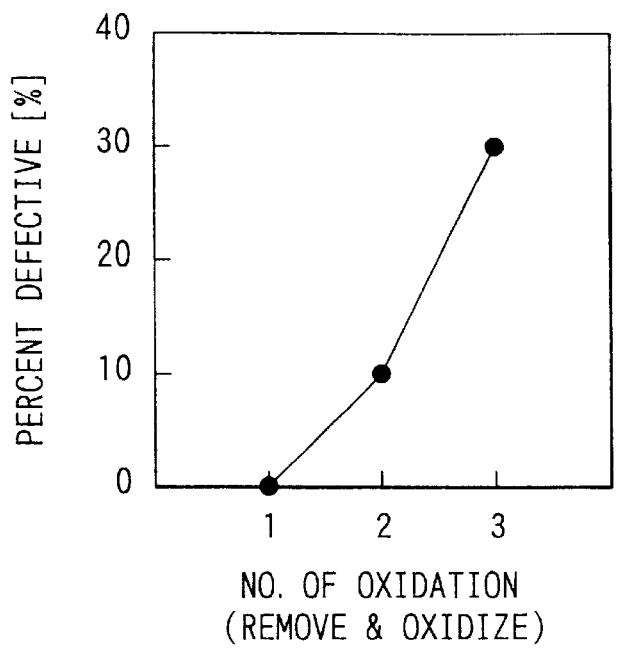
FIG. 4 is a graph showing a percent defective of an oxidized film versus the number of oxidation processes, where oxidation and removal processes are repeated.

FIG. 4 shows a percent defective of the oxidized film versus the number of oxidation processes performed after removal of a previously formed film. The film quality is determined to be defective if its voltage endurance is lower than 9 MV/cm. In the processes shown in FIGS. 1 and 3, a preliminary sacrificing oxidized film is made and removed before the real oxidized film is formed though it is not shown. In the graph of FIG. 4, such a preliminary process is not counted. Therefore, the number of oxidations for forming the dioxide film 16 shown in FIG. 3F, for example, is counted as two. Capacitors used in this experiment are made as follows: $1 \times 10^{13}$ atoms/$cm^2$ boron are diffused into the silicon layer to form a diffused layer, and then an oxidized film having a thickness of 32 nm and an area of 0.08 $mm^2$ is formed on the diffused layer. The high temperature heat treatment is performed at 1050° C. for 430 minutes. It is seen in the graph of FIG. 4 that the percent defective of the silicon dioxide layer increases as the number of oxidation processes becomes higher.

Figure 5:
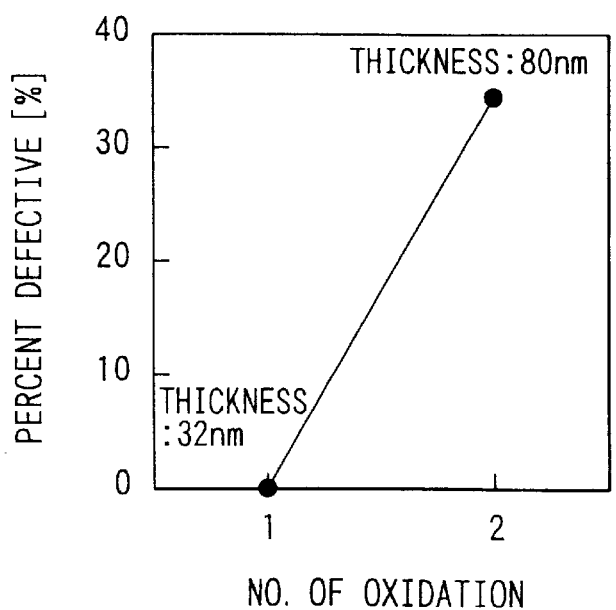
FIG. 5 is a graph showing a percent defective of an oxidized film versus the number of oxidation processes, where oxidation processes are repeated to overlaying an additional film on a previously formed film.

FIG. 5 shows a percent defective of the oxidized film versus the number of oxidation processes performed to overlay a new film on a previously formed film. For example, the number of oxidation processes performed for forming the oxidized film 15 shown in FIG. 3F is counted as two. In this experiment, the dioxide film is determined as defective if its voltage endurance is lower than 8 MV/cm. Capacitors used in this experiment are made as follows:

$3 \times 10^{15}$ atoms/cm$^2$ phosphorus are diffused into the silicon layer to form a diffused layer, and then an oxidized film of 0.08 mm$^2$ is formed on the diffused layer. The high temperature heat treatment is performed at 1050° C. for 430 minutes. The thickness of the oxidized film initially formed is 32 nm and that of the dioxide film overlaid is 80 nm. It is seen in the graph of FIG. 5 that the quality of the overlaid film is much worse than that of the initial film.

Figure 6:
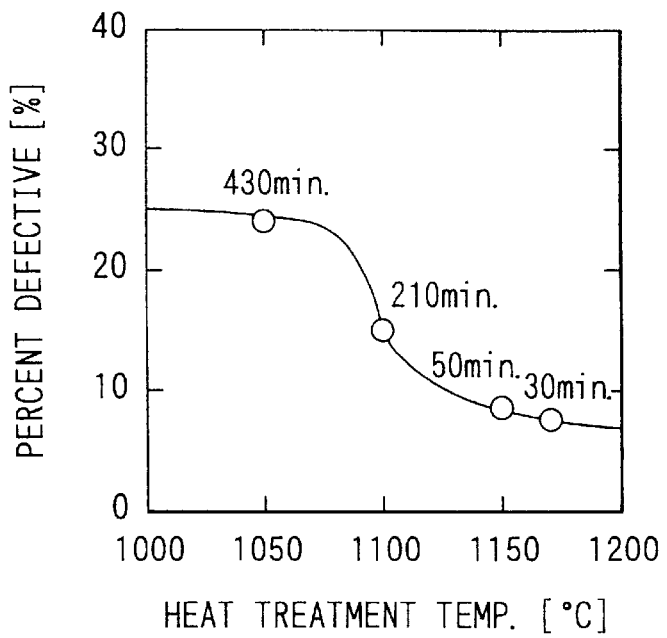
FIG. 6 is a graph showing a percent defective of an oxidized film formed on a boron-doped silicon layer versus a heat treatment temperature.

To improve the oxidized film quality, extensive efforts have been made to properly set the conditions of the high temperature heat treatment. FIG. 6 shows results of experiments for the films formed by re-oxidation after removal of a previously formed film. Samples of the silicon dioxide film are made in the same manner as in the experiment shown in FIG. 4. That is, $1 \times 10^{13}$ atoms/cm$^2$ boron are diffused into the silicon layer to form a diffused layer (boron density is $1 \times 10^{17}$/cm$^3$), and an oxidized film having a thickness of 32 nm and an area of 0.08 mm$^2$ is formed as a final film. The heat treatment conditions are variously set and the film quality is evaluated. It is seen in the graph of FIG. 6 that the percent defective of the film is lowered as the heat treatment temperature becomes higher than 1100° C. Especially, when the heat treatment temperature is higher than 1150° C., the percent defective is remarkably lowered.

Figure 7:
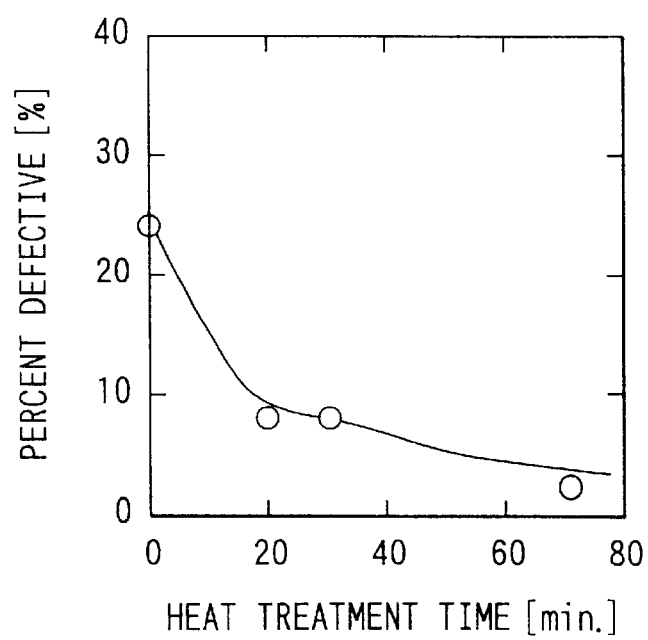
FIG. 7 is a graph showing a percent defective of an oxidized film formed on a boron-doped silicon layer versus a heat treatment time.

FIG. 7 shows the percent defective of the oxidized film versus the heat treatment time. Test samples are the same as those used in the above experiment, but the heat treatment temperature is fixed to 1170° C. It is seen in the graph that the percent defective is low when the heat treatment time is longer than 20 minutes.

Figure 8:
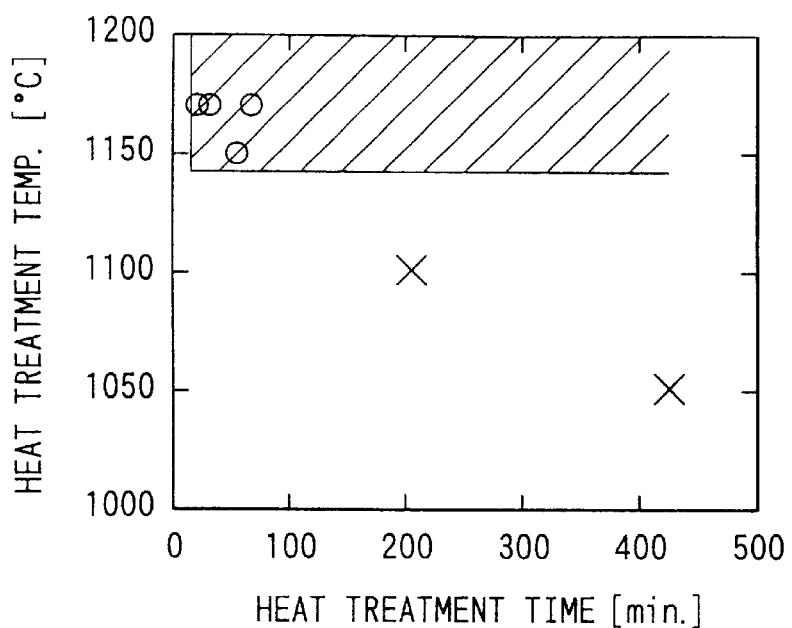
FIG. 8 is a graph showing a range of the heat treatment time and temperature, in which a quality oxidized film is formed on a boron-doped silicon layer.

Proper conditions of the heat treatment for obtaining a quality oxidized film are shown in the graph of FIG. 8, combining the results shown in FIGS. 6 and 7. Circle marks in the graph show the conditions under which quality films are obtained, and cross marks show improper conditions. It is seen that quality oxidized films can be obtained when they are heat-treated for 20 minutes or longer at a temperature higher than 1100° C., preferably, 1150° C. or higher, in the case where the boron-diffused layer is used as the diffused layer.

Figure 9:
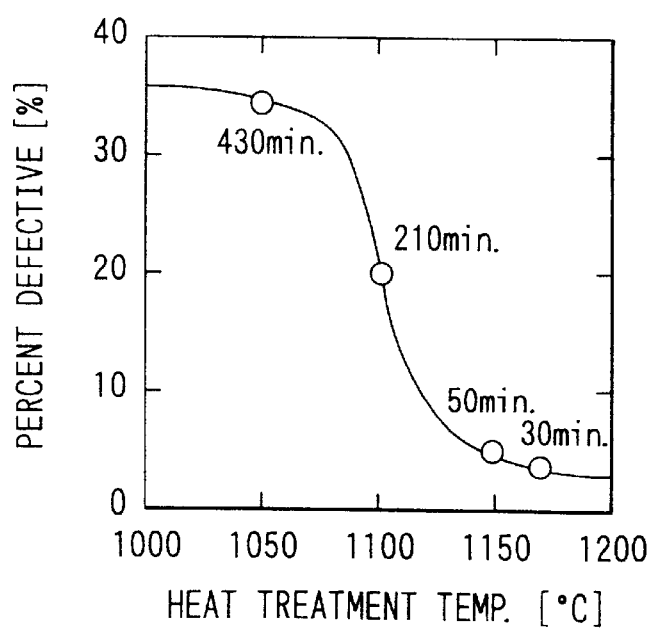
FIG. 9 is a graph showing a percent defective of an oxidized film formed on a phosphorus-doped silicon layer versus a heat treatment temperature.

Further, experiments for evaluating quality of the oxidized film formed by overlaying another film on a previously formed film are carried out. FIG. 9 shows results of experiments for the films formed by overlaying a new film. Samples of the oxidized film are made in the same manner as in the experiment shown in FIG. 5. That is, $3 \times 10^{15}$ atoms/cm$^2$ phosphorus are diffused into the silicon layer to form a diffused layer (phosphorus density is $3 \times 10^{19}$/cm$^3$), and an oxidized film having a thickness of 80 nm and an area of 0.08 mm$^2$ is formed as a final film (overlaid film). The heat treatment conditions are variously set and the film quality is evaluated under the same criteria as those used in the experiment shown in FIG. 5. It is seen in the graph of FIG. 9 that the percent defective of the film is lowered as the heat treatment temperature becomes higher. When the heat treatment temperature is higher than 1100° C., the percent defective is remarkably lowered, especially at 1150° C. or higher.

Figure 10:
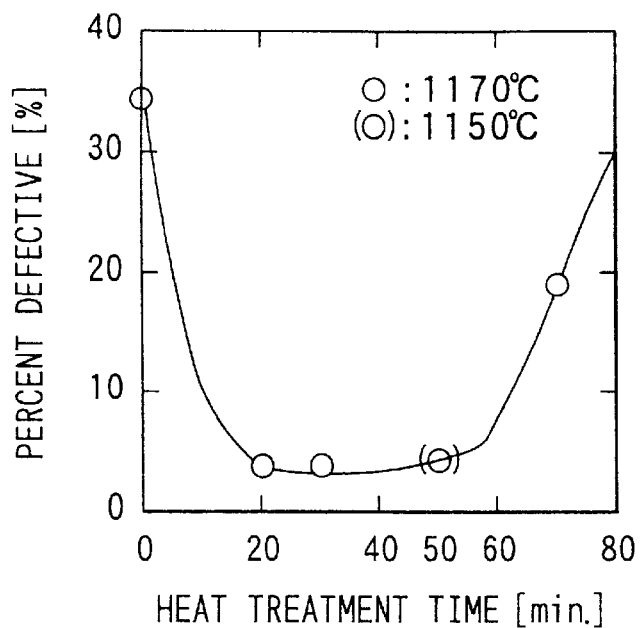
FIG. 10 is a graph showing a defective percent of an oxidized film formed on a phosphorus-doped silicon layer versus a heat treatment time.

FIG. 10 shows the percent defective of the oxidized film versus the heat treatment time. Test samples are the same as those used in the above experiment, but the heat treatment temperature is fixed to 1170° C. (except for one datum shown by a circle mark in parentheses). It is seen in the graph that the percent defective is low when the heat treatment time is 20 minutes or longer but shorter than 50 minutes.

Figure 11:
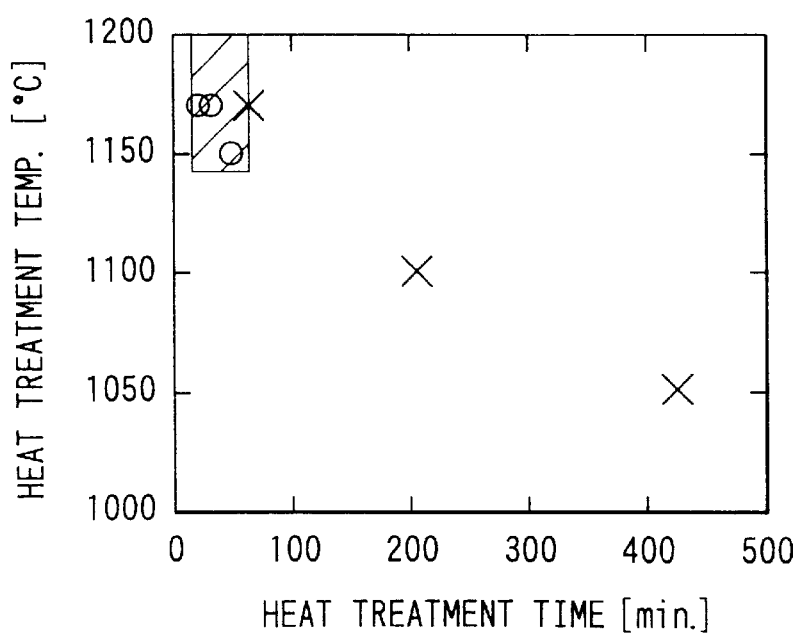
FIG. 11 is a graph showing a range of the heat treatment time and temperature, in which a quality oxidized film is formed on a phosphorus-doped silicon layer.

Proper conditions of the heat treatment for obtaining a quality oxidized film (overlaid) are shown in the graph of FIG. 11, combining the results shown in FIGS. 9 and 10. Circle marks in the graph show the conditions under which quality films are obtained, and cross marks show improper conditions. It is seen that quality oxidized films can be obtained when they are heat-treated for a time between 20 minutes and 50 minutes at a temperature higher than 1100° C., preferably higher than 1150° C., in the case where the phosphorus-diffused layer is used as the diffused layer.

Optimum heat treatment conditions depend on the impurity density in the diffused layer. Generally, the conditions become less strict as the density becomes lower. But in any event, if the heat treatment conditions set forth above are used, quality oxidized films can be formed. The above heat treatment conditions are applicable not only to the films formed by overlaying or re-oxidation after removal but also to the films formed by a single oxidation process shown in FIG. 1. In the process shown in FIGS. 3A–3G, the quality of the oxidized films 15, 16 is improved by heat-treating under the conditions set forth above (e.g., at 1170° C. for 30 minutes) in the N$_2$ atmosphere. Since the heat treatment is performed after both films 15 and 16 are formed, the quality of both films can be improved at the same time by a single heat treatment.

In the case where other elements are built on a single SOI substrate together with capacitors, the high temperature heat treatment can be performed commonly to other elements. For example, the heat treatment of the present invention is applicable to a device that includes a lateral diffused MOS (such an LDMOS as disclosed in JP-A-9-139438) and two capacitors formed on the oxidized films each having a different thickness. A process of manufacturing such a device will be described below with reference to FIGS. 12 and 13A–13G.

Figure 12:
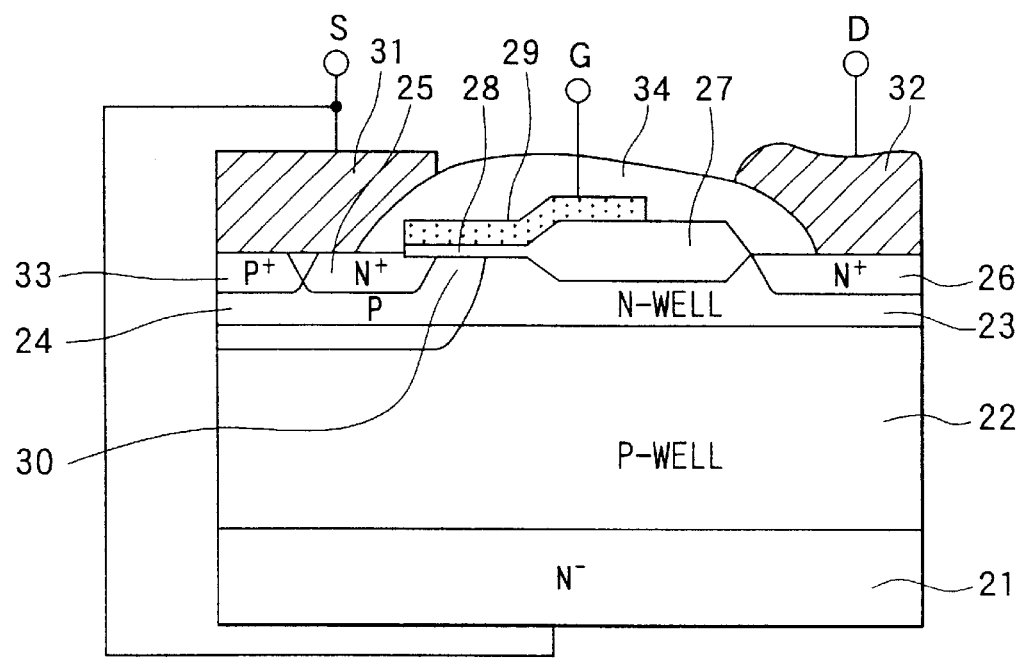
FIG. 12 is a cross-sectional view showing a lateral diffused MOS (LDMOS)

The structure of the LDMOS will be briefly described referring to FIG. 12 that schematically shows its structure. A P-well 22 is formed on an N$^-$ layer 21, and an N-well 23 is formed on the P-well 22. A channel P-well 24 is formed in the N-well 23, and an N-diffused layer 25 is formed in the P-well 24. An N-diffused layer 26 is formed in the N-well 23. On the surface, a LOCOS oxidation layer 27 is formed, and a gate electrode 29 is formed on a gate oxidation film 28. A channel region 30 is formed on the surface of the channel P-well 24, which is positioned directly underneath the gate electrode 29. Reference numbers 31 and 32 denote a source electrode and a drain electrode, respectively. Reference number 33 denotes a diffusion layer for taking a potential of the channel P-well 24, and the reference number 34 denotes an insulation film covering layers.

In this LDMOS, the N-diffused layer 25 functions as a source region, the N-diffused layer 26 as a drain region, and the N-well 23 underneath the LOCOS oxidation layer 27 as a drift region. A dopant density in the N-well 23 is set to satisfy so-called RESURF conditions.

Now, referring to FIGS. 13A–13G, a method of forming two capacitors each having a respectively different oxidized film thickness together with the LDMOS will be described. First, in the step shown in FIG. 13A, an SOI substrate that has an N-type substrate 41 formed on an insulation layer 42 is prepared. The N-type substrate 41 includes an N$^+$ layer 41b and an N$^-$ layer 41a (corresponds to the N$^-$ layer 21 shown in FIG. 12) formed on the N$^+$ layer 41b. Trench holes are made through the substrate 41, and the walls of the trench holes are covered with oxidized films 43 and then the trench holes are filled with poly-silicon 44. Then, a deep N$^+$ layer 45 is formed in a region where the LDMOS is to be made. Then, ion-implantation is performed to form the P-well 22 and N-well 23, and the implanted impurities are simultaneously diffused. In this case, boron is diffused into the P-well 22 and phosphorus into the N-well 23. Due to a diffusion coefficient difference between boron and phosphorus, the P-well 22 becomes deeper than the N-well 23.

In the step shown in FIG. 13B, phosphorus is implanted and driven-in into a region A to form a diffused layer 12, and boron into a region B to form a diffused layer 13, in the same manner as in the process shown in FIGS. 3A and 3B. In the step shown in FIG. 13C, LOCOS oxidation layers 46 are formed both in the capacitor region and the LDMOS region. The LOCOS oxidation layer 46 formed in the LDMOS region corresponds to the LOCOS oxidation layer 27 shown in FIG. 12, and the LOCOS oxidation layer 46 formed in the capacitor region corresponds to the LOCOS oxidation layer 14 shown in FIG. 3C. In the step shown in FIG. 13D, an oxidized film 15 is formed by thermal oxidation in the same manner as in the process shown in FIG. 3D.

Figure 13E:
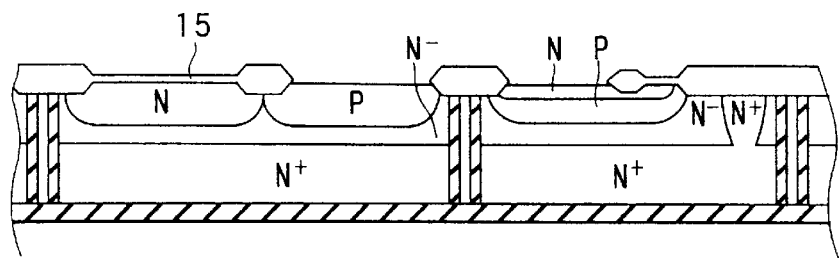
Figure 13F:
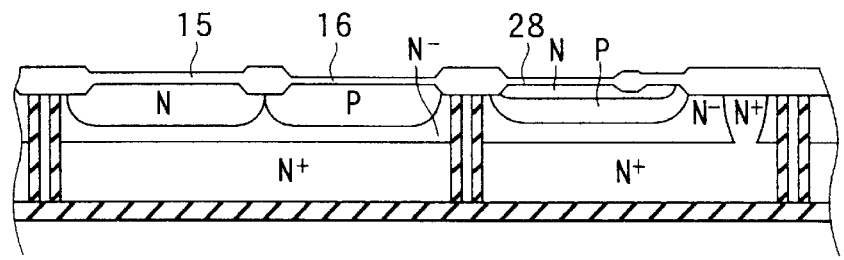

In the step shown in FIG. 13E, the oxidized film 15 positioned in region B of the capacitor region and in a region for forming a gate oxidation film of the LDMOS is removed by wet etching, other portions being masked. In the step shown in FIG. 13F, thermal oxidation is performed again in a predetermined amount. A thick oxidized film 15 is formed in region A because the oxidized film formed by the second oxidation overlays on the oxidized film formed by the first oxidation. On the other hand, a thin oxidized film 16 is formed in region B. In the LDMOS region, a gate oxidation film 28 is formed by the second oxidation.

Figure 13G:
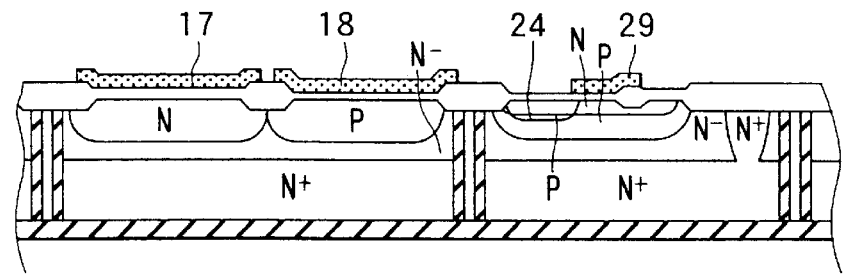

In the step shown in FIG. 13G, phosphorus-doped poly-silicon is patterned to form a gate electrode 29 of the LDMOS and electrodes 17, 18 of the capacitors. Then, boron ions are implanted to form a channel region of the LDMOS. Then, the high temperature heat treatment is performed in the $N_2$ atmosphere, for 30 minutes at 1170° C., for example. By this high temperature heat treatment, the channel P-well 24 is formed in the LDMOS region, and quality of the oxidized films 15, 16 is improved at the same time. Thereafter, the LDMOS and two capacitors are completed through conventional steps. In the steps to be carried out after the step shown in FIG. 13G, no heat treatment is performed at a temperature equal to or higher than the temperature of the high temperature heat treatment performed in the step shown in FIG. 13G.

Though the process for forming capacitors and the LDMOS on a single SOI substrate is described above, it is also possible to form other elements such as CMOS or bipolar transistors together with the capacitors. Quality of the oxidized films for those elements can be similarly improved by the high temperature heat treatment.

Figure 14:
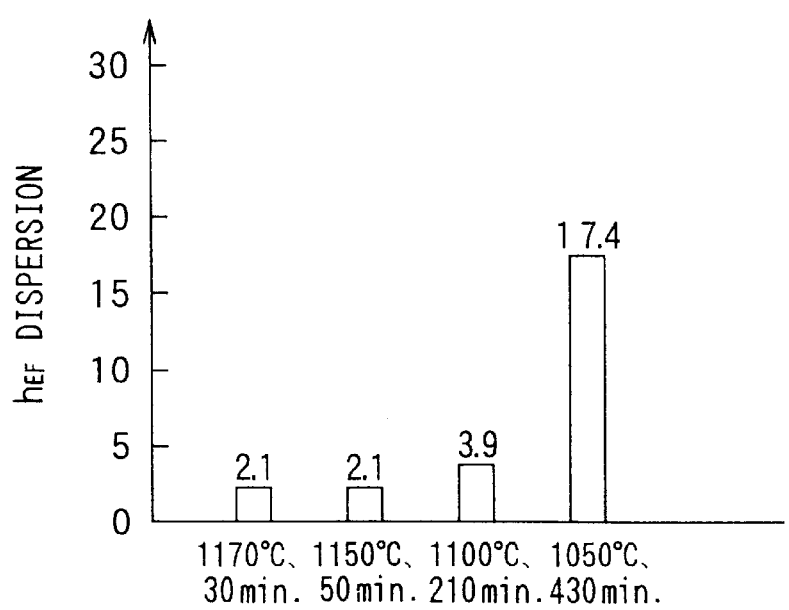
FIG. 14 is a graph showing an $h_{EF}$ dispersion of bipolar transistors versus heat treatment temperature and time.

In addition, it is found out that $h_{EF}$ dispersion of bipolar transistors can be improved by the high temperature heat treatment. More particularly, when bipolar transistors (e.g., NPN transistors) are formed in regions divided by a trench, leakage and large $h_{EF}$ dispersion occur due to a crystal defect. As shown in FIG. 14, the $h_{EF}$ is highly dispersed under heat treatment at 1050° C. However, when the heat treatment is performed at a temperature higher than 1100° C., the dispersion is remarkably reduced. This means that the high temperature heat treatment at a temperature higher than 1100° C., preferably higher than 1150° C., can improve the $h_{EF}$ dispersion of bipolar transistors, in the case where a device is a composite device that includes LDMOS, capacitors, CMOS and bipolar transistors.

Other films, such as ONO films, than the oxidized film described above may also be improved by the high temperature heat treatment. The doped poly-silicon used in the embodiment described above may be replaced with other poly-silicon such as ion-implanted poly-silicon or poly-silicon-as-deposited. The high temperature heat treatment can be performed either after or before the poly-silicon electrodes are formed on the oxidized film. The present invention is also applicable to other diffused layers than the boron-diffused or phosphorus-diffused layers. For example, it is applicable to an arsenic-diffused layer.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A method of forming an oxidized film on an SOI substrate, the method comprising:

forming a diffused layer on a silicon layer of the SOI substrate;

forming an oxidized film on the diffused layer; and heat-treating the oxidized film at a temperature of 1100° C. or higher.

2. The method of forming an oxidized film as in claim 1, the method further including processes for forming other semiconductor elements on the same SOI substrate on a region different from a region on which the oxidized film is formed, wherein:

the step of heat-treating the oxidized film is common to a heat-treatment step for forming the other semiconductor elements.

3. The method of forming oxidized films as in claim 1, wherein the silicon layer on the SOI is only composed of an $N^-$ type layer.

4. The method of forming oxidized films as in claim 1, wherein the silicon layer on the SOI is composed of an $N^-$ type layer and an $N^+$ type layer.

5. A method of forming an oxidized film on an SOI substrate, the method comprising:

forming a boron-diffused layer by diffusing boron into a silicon layer on the SOI substrate as an impurity;

forming an oxidized film on the boron-diffused layer; and heat-treating the oxidized film at a temperature of 1100° C. or higher for 20 minutes or longer.

6. The method of forming an oxidized film as in claim 5, wherein:

in the step of forming the boron-diffused layer, boron in an amount of $1 \times 10^{13}$ atoms/cm$^2$ or less is implanted by ion-implantation and driven-in into the silicon layer.

7. The method of forming an oxidized film as in claim 5, wherein the step of forming the oxidized film includes steps of:

thermally oxidizing the silicon layer to form a provisional oxidized film;

removing the provisional oxidized film by wet-etching; and thermally oxidizing again the silicon layer to form the oxidized film.

8. The method of forming an oxidized film as in claim 5, the method further including processes for forming other semiconductor elements on the same SOI substrate on a region different from a region on which the oxidized film is formed, wherein:

the step of heat-treating the oxidized film is common to a heat-treatment step for forming the other semiconductor elements.

9. The method of forming oxidized films as in claim 5, wherein the silicon layer on the SOI is only composed of an N⁻ type layer.

10. The method of forming oxidized films as in claim 5, wherein the silicon layer on the SOI is composed of an N⁻ type layer and an N⁺ type layer.

11. A method of forming an oxidized film on an SOI substrate, the method comprising:

forming a phosphorus-diffused layer by diffusing phosphorus into a silicon layer on the SOI substrate as an impurity;

forming an oxidized film on the phosphorus-diffused layer; and heat-treating the oxidized film at a temperature of 1100° C. or higher for a time of 20 minutes or longer but not exceeding 60 minutes.

12. The method of forming an oxidized film as in claim 11, wherein:

in the step of forming the phosphorus-diffused layer, phosphorus in an amount of $3\times10^{15}$ atoms/cm² or less is implanted by ion-implantation and driven-in into the silicon layer.

13. The method of forming an oxidized film as in claim 11, wherein the step of forming the oxidized film includes steps of:

thermally oxidizing the silicon layer to form a first oxidized film; and thermally oxidizing again the silicon layer to form a second oxidized layer overlaying the first oxidized film.

14. The method of forming an oxidized film as in claim 11, the method further including processes for forming other semiconductor elements on the same SOI substrate on a region different from a region on which the oxidized film is formed, wherein:

the step of heat-treating the oxidized film is common to a heat-treatment step for forming the other semiconductor elements.

15. The method of forming oxidized films as in claim 11, wherein the silicon layer on the SOI is only composed of an N⁻ type layer.

16. The method of forming oxidized films as in claim 11, wherein the silicon layer on the SOI is composed of an N⁻ type layer and an N⁺ type layer.

17. A method of forming oxidized films on an SOI substrate, the method comprising:

preparing an SOI substrate having a silicon layer on an insulation film;

forming a first diffused layer for forming a first capacitor thereon and a second diffused layer for forming a second capacitor thereon;

forming a first oxidized film on the first diffused layer and a second oxidized film on the second diffused layer; and heat-treating the first and second oxidized films at a temperature of 1100° C. or higher for 20 minutes or longer.

18. The method of forming oxidized films as in claim 17, the method further including: after the oxidized film forming step and before the heat-treating step, a step of patterning poly-silicon to form electrodes for the first and second capacitors.

19. The method of forming oxidized films as in claim 17, wherein:

phosphorus in an amount of $3\times10^{15}$ atoms/cm² or less is implanted by ion-implantation and driven-in into the silicon layer to form the first diffused layer; and boron in an amount of $1\times10^{13}$ atoms/cm² or less is implanted by ion-implantation-and driven-in into the silicon layer to form the second diffused layer.

20. The method of forming oxidized films as in claim 17, wherein the step of forming the first and the second oxidized films includes steps of:

thermally oxidizing the silicon layer to form a preliminary oxidized film both on the first and the second diffused layers;

removing the preliminary oxidized film on the second diffused layer by wet-etching, while keeping the preliminary oxidized film on the first diffused layer; and thermally oxidizing again the silicon layer to form a new oxidized film on both diffused layers, thereby forming the second oxidized film on the second diffused layer and forming the first oxidized film on the first diffused layer by overlaying the new oxidized film on the preliminary oxidized film.

21. The method of forming oxidized films as in claim 17, the method further including processes for forming an LDMOS on the same SOI substrate on a region electrically insulated from a region on which the first and second oxidized films are formed, wherein:

the step of heat-treating the oxidized films is common to a step of forming a channel of the LDMOS.

* * * * *